United States Patent
Hu et al.

(10) Patent No.: US 8,582,388 B1
(45) Date of Patent: Nov. 12, 2013

(54) SERIAL ADVANCED TECHNOLOGY ATTACHMENT DUAL IN-LINE MEMORY MODULE (SATA DIMM) CAPABLE OF PREVENTING DATA LOSS

(75) Inventors: Wen-Sen Hu, Shenzhen (CN); Wei-Min He, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/564,762

(22) Filed: Aug. 2, 2012

(30) Foreign Application Priority Data

Jun. 7, 2012 (CN) .......................... 2012 1 0185076

(51) Int. Cl.
*G11C 5/14* (2006.01)
(52) U.S. Cl.
USPC ................ 365/228; 365/226; 365/51; 365/63
(58) Field of Classification Search
USPC ................................ 365/51, 63, 228, 229, 226
See application file for complete search history.

(56) References Cited

U.S. PATENT DOCUMENTS

| 8,514,603 B2 * | 8/2013 | Yin et al. .................... 365/63 |
| 2004/0145939 A1 * | 7/2004 | Yoshida et al. ............... 365/145 |
| 2013/0127441 A1 * | 5/2013 | Tseng et al. ................. 324/76.11 |
| 2013/0155637 A1 * | 6/2013 | Yin et al. ..................... 361/791 |

* cited by examiner

*Primary Examiner* — Andrew Q Tran
(74) *Attorney, Agent, or Firm* — Altis & Wispro Law Group, Inc.

(57) ABSTRACT

A serial advanced technology attachment dual in-line memory module device includes a power circuit, a storage chip, a control chip connected to the storage chip, and a detecting chip storing a preset voltage. The detecting chip includes a detecting pin connected to a power circuit through a first resistor and grounded through a second resistor, a ground pin grounded, a voltage pin connected to the power circuit, the control chip, and the storage chip, and an output pin connected to the storage chip. The detecting chip compares an output voltage of the power circuit detected by the detecting pin with the preset voltage, to output a control signal through the output pin to the control chip in response to the detected voltage being less than the preset voltage, to signal the control chip to control the storage chip to store data.

4 Claims, 1 Drawing Sheet

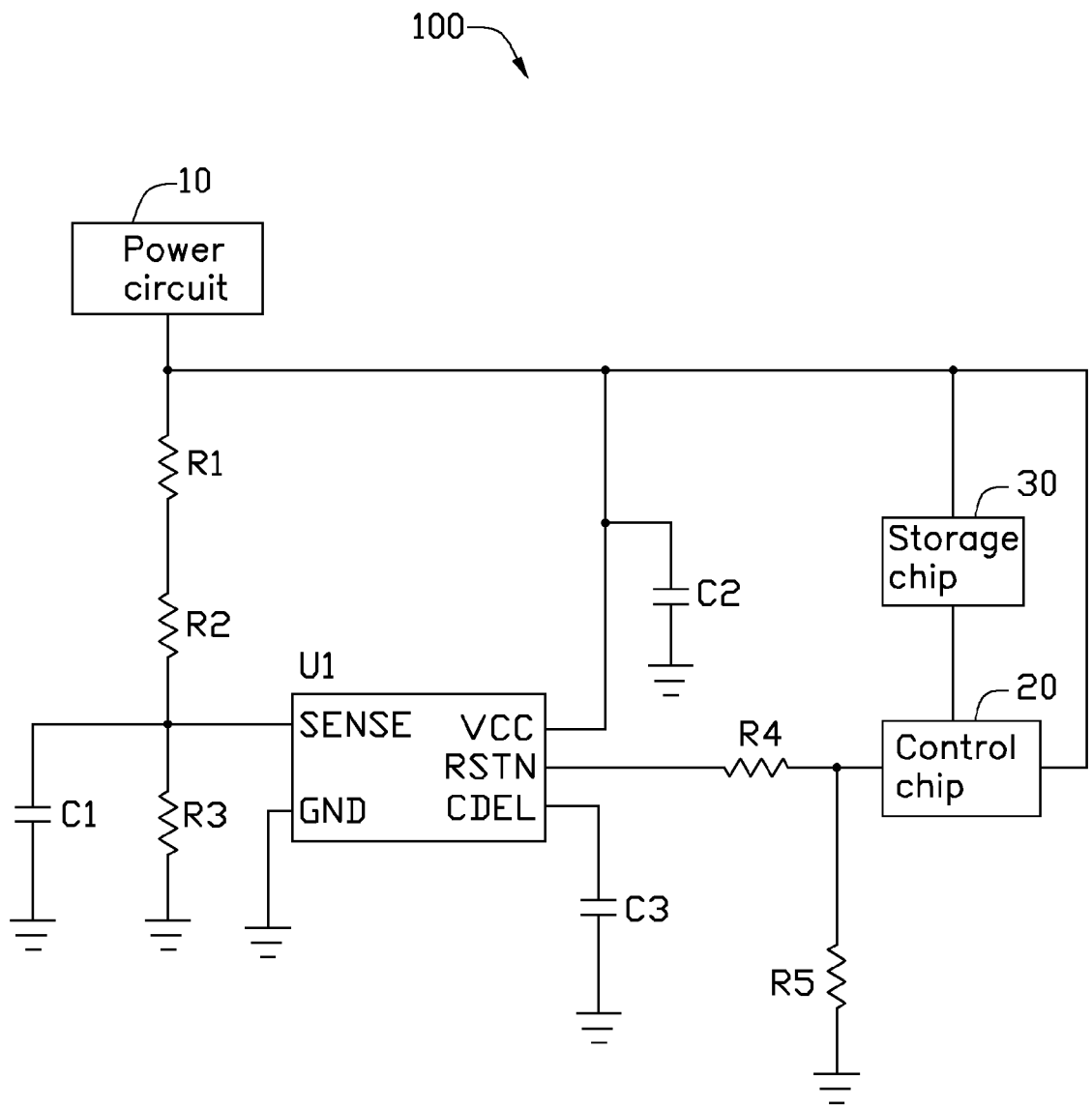

SERIAL ADVANCED TECHNOLOGY ATTACHMENT DUAL IN-LINE MEMORY MODULE (SATA DIMM) CAPABLE OF PREVENTING DATA LOSS

BACKGROUND

1. Technical Field

The present disclosure relates to serial advanced technology attachment dual in-line memory module (SATA DIMM) devices, and particularly to a SATA DIMM device providing data loss protection.

2. Description of Related Art

At present, solid state drives (SSD) store data on chips instead of on magnetic or optical discs. One type of SSD has the form factor of a DIMM module and is called a SATA DIMM module. The SATA DIMM module can be inserted into a memory slot of a motherboard, to receive voltages from the motherboard through the memory slot and receive hard disk drive (HDD) signals through SATA connectors arranged on the SATA DIMM module and connected to a SATA connector of the motherboard. However, the SATA DIMM device may lose data when the motherboard is powered off abnormally. Therefore, there is room for improvement in the art.

BRIEF DESCRIPTION OF THE DRAWING

Many aspects of the embodiments can be better understood with reference to the following drawing. The components in the drawing are not necessarily drawn to scale, the emphasis instead being placed upon clearly illustrating the principles of the present embodiments.

The FIGURE is a circuit diagram of a serial advanced technology attachment dual in-line memory module device in accordance with an exemplary embodiment of the present disclosure.

DETAILED DESCRIPTION

The disclosure, including the drawing, is illustrated by way of example and not by way of limitation. References to "an" or "one" embodiment in this disclosure are not necessarily to the same embodiment, and such references mean at least one.

Referring to the FIGURE, a serial advanced technology attachment dual in-line memory module (SATA DIMM) device 100 in accordance with an exemplary embodiment includes a power circuit 10, resistors R1-R5, capacitors C1-C3, at least one storage chip 30, a control chip 20, and a detecting chip U1 to store a preset voltage. Other elements of the SATA DIMM device 100 are known to those skilled in the art of SATA DIMM devices.

The power circuit 10 is connected to a voltage pin VCC of the detecting chip U1, the storage chip 30, and the control chip 20, to receive a voltage (such as 3.3 volts (V)) from the motherboard. The power circuit 10 converts the 3.3V received from the motherboard to 5V and provides the 5V to the detecting chip U1, the storage chip 30, and the control chip 20. A sensing pin SENSE of the detecting chip U1 is connected to the power circuit 10 through the resistors R1 and R2 connected in series, and also grounded through the resistor R3. The capacitor C1 is connected between the sensing pin SENSE of the detecting chip U1 and ground. A ground pin GND of the detecting chip U1 is grounded. The capacitor C2 is connected between the voltage pin VCC of the detecting chip U1 and ground. The capacitor C3 is connected between an input/output (I/O) pin CDEL of the detecting chip U1 and ground. An output pin RSTN of the detecting chip U1 is connected to a first terminal of the resistor R4. A second terminal of the resistor R4 is connected to the control chip 20. The resistor R5 is connected between the second terminal of the resistor R4 and ground. The control chip 20 is connected to the storage chip 30. In one embodiment, resistances of the resistors R1-R3 are respectively 39 kohms, 3.9 kohms, and 4.7 kohms. When an output voltage of the power circuit 10 is 5V, a voltage VR3 of the resistor R3 follows the format, $VR3=5/(R1+R2+R3)*R3=0.5(V)$, and the preset voltage stored in the detecting chip U1 is 0.5V. When the power circuit 10 operates abnormally, the output voltage of the power circuit 10 detected by the detecting pin SENSE of the detecting chip U1 is less than 0.5V. When the power circuit 10 operates normally, the output voltage of the power circuit 10 detected by the detecting pin SENSE of the detecting chip U1 is equal to or greater than 0.5V.

In use, the detecting chip U1 compares the output voltage of the power circuit 10 detected by the detecting pin SENSE and the preset voltage. If the detected voltage is less than 0.5V, the power circuit 10 operates abnormally. The output pin RSTN of the detecting chip U1 outputs a control signal to the control chip 20. The control chip 20 controls the storage chip 30 to store data according to the control signal, to prevent the SATA DIMM device 100 from losing data.

The SATA DIMM device 100 can avoid losing data by comparing the output voltage of the power circuit 10 detected by the detecting chip U1 with the preset voltage, and outputting a control signal to the control chip 20 for signaling the control chip 20 to control the storage chip 30 to store data when the detected voltage is less than the preset voltage.

Even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A serial advanced technology attachment dual in-line memory module (SATA DIMM) device, comprising:
   a first resistor;
   a second resistor;
   a power circuit;
   at least one storage chip;
   a control chip connected to the at least one storage chip; and
   a detecting chip storing a preset voltage, and comprising a detecting pin connected to the power circuit through the first resistor and grounded through the second resistor, a ground pin grounded, a voltage pin connected to the power circuit, the control chip, and the at least one storage chip, and an output pin connected to the at least one storage chip;
   wherein the detecting chip compares an output voltage of the power circuit detected by the detecting pin of the detecting chip with the preset voltage, to output a control signal through the output pin of the detecting chip to the control chip in response to the detected voltage being less than the preset voltage, to signal the control chip to control the storage chip to store data.

2. The SATA DIMM device of claim 1, further comprising third to fifth resistors, wherein the third resistor is connected between the first resistor and the detecting pin of the detecting chip, the fourth resistor is connected between the output pin of the detecting chip and the control chip, the fifth resistor is connected between the control chip and the ground potential.

3. The SATA DIMM device of claim 2, wherein resistances of the first to third resistors are respectively 39 kohms, 4.7 kohms, and 3.9 kohms.

4. The SATA DIMM device of claim 1, further comprising first to third capacitors, wherein the first capacitor is connected between the detecting pin of the detecting chip and the ground potential, the second capacitor is connected between the voltage pin of the detecting chip and the ground potential, the third capacitor is connected between an input/output pin of the detecting chip and the ground potential.

* * * * *